United States Patent
Sugiura et al.

(10) Patent No.: US 11,641,780 B2
(45) Date of Patent: May 2, 2023

(54) THERMOELECTRIC CONVERSION ELEMENT AND ARTICLE HAVING THERMOELECTRIC CONVERSION ELEMENT

(71) Applicants: FUJIFILM BUSINESS INNOVATION CORP., Tokyo (JP); NATIONAL UNIVERSITY CORPORATION CHIBA UNIVERSITY, Chiba (JP)

(72) Inventors: Satoya Sugiura, Ebina (JP); Wataru Yamada, Ebina (JP); Katsuyoshi Hoshino, Chiba (JP)

(73) Assignees: FUJIFILM BUSINESS INNOVATION CORP., Tokyo (JP); NATIONAL UNIVERSITY CORPORATION CHIBA UNIVERSITY, Chiba (JP)

( * ) Notice: Subject to any disclaimer, the term of this patent is extended or adjusted under 35 U.S.C. 154(b) by 108 days.

(21) Appl. No.: 17/145,504

(22) Filed: Jan. 11, 2021

(65) Prior Publication Data

US 2021/0226111 A1     Jul. 22, 2021

(30) Foreign Application Priority Data

Jan. 22, 2020    (JP) .............................. JP2020-008491

(51) Int. Cl.
    *H10N 10/856*      (2023.01)
    *C08G 61/12*      (2006.01)
    *H01L 35/24*      (2006.01)

(52) U.S. Cl.
    CPC ............ *H01L 35/24* (2013.01); *C08G 61/126* (2013.01); *C08G 2261/11* (2013.01); *C08G 2261/1424* (2013.01); *C08G 2261/3223* (2013.01); *C08G 2261/55* (2013.01); *C08G 2261/712* (2013.01)

(58) Field of Classification Search
    CPC ................. C03C 17/44; C08G 61/126; C08G 2261/3223; C08G 2261/43; C08G 2261/792
See application file for complete search history.

(56) References Cited

U.S. PATENT DOCUMENTS

| | | | |
|---|---|---|---|
| 2015/0107638 A1 | 4/2015 | Takahashi | |
| 2016/0075917 A1* | 3/2016 | Hoshino | ............... C09D 181/02 526/256 |
| 2019/0338162 A1* | 11/2019 | Hoshino | ................. C03C 17/44 |

FOREIGN PATENT DOCUMENTS

| | | | |
|---|---|---|---|
| JP | 2013-098299 A | 5/2013 | |
| JP | 5848284 B2 | 1/2016 | |

* cited by examiner

*Primary Examiner* — Shane Fang
(74) *Attorney, Agent, or Firm* — Oliff PLC

(57) ABSTRACT

A thermoelectric conversion element includes: a thermoelectric conversion layer containing a thiophene polymer, in which a peak intensity of a diffraction angle (2θ) of 7.9° is 5 times or more a peak intensity of a diffraction angle (2θ) of 25.8° in an X-ray diffraction spectrum of the thermoelectric conversion layer.

19 Claims, No Drawings

THERMOELECTRIC CONVERSION ELEMENT AND ARTICLE HAVING THERMOELECTRIC CONVERSION ELEMENT

CROSS-REFERENCE TO RELATED APPLICATIONS

This application is based on and claims priority under 35 USC 119 from Japanese Patent Application No. 2020-008491 filed on Jan. 22, 2020.

BACKGROUND

Technical Field

The present invention relates to a thermoelectric conversion element and an article having the thermoelectric conversion element.

Related Art

Various inorganic materials are used in thermoelectric conversion elements that mutually convert thermal energy and electrical energy. On the other hand, in recent years, research on thermoelectric conversion elements using organic materials has been actively promoted.

Among these, conductive polymers are expected to be high-performance materials because of exhibiting conductivity by localizing electric charges in the element and inevitably exhibiting a thermoelectric conversion function. As such conductive polymers, various conductive polymers such as polyaniline, polyphenylene vinylene, and polythiophene (for example, polyethylene dioxythiophene (PEDOT)) have been studied.

Specifically, for example, Patent Literature 1 discloses "a thermoelectric conversion element using, as a thermoelectric conversion layer, a thermoelectric conversion material containing a polythiophene polymer, carbon nanotubes, and a non-conjugated polymer".

In addition, Patent Literature 2 discloses "a thermoelectric conversion element using a thermoelectric conversion material containing a conductive polymer, carbon nanotubes, and an onium salt compound, and having a conductivity anisotropy of 1.5 to 10".

Patent Literature 1: Japanese Patent No. 5848284
Patent Literature 2: JP-A-2013-098299

SUMMARY

Aspects of non-limiting embodiments of the present disclosure relates to a thermoelectric conversion element excellent in thermoelectric conversion function as compared with a case where, in a thermoelectric conversion element including a thermoelectric conversion layer containing a thiophene polymer, a peak intensity of a diffraction angle ($2\theta$) of $7.9°$ is less than 5 times a peak intensity of a diffraction angle ($2\theta$) of $25.8°$ in an X-ray diffraction spectrum of the thermoelectric conversion layer, or a specular reflectance of the thermoelectric conversion layer is less than 10%.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a thermoelectric conversion element including: a thermoelectric conversion layer containing a thiophene polymer, in which a peak intensity of a diffraction angle ($2\theta$) of $7.9°$ is 5 times or more a peak intensity of a diffraction angle ($2\theta$) of $25.8°$ in an X-ray diffraction spectrum of the thermoelectric conversion layer.

DETAILED DESCRIPTION

Hereinafter, an exemplary embodiment as an example of the present invention will be described in detail.

In the numerical ranges described in stages, an upper limit or a lower limit described in one numerical range may be replaced with an upper limit or a lower limit of the numerical range described in other stages.

Further, in the numerical ranges, the upper limit or the lower limit described in a numerical range may be replaced with values shown in Examples.

In a case of the amount of each component in a composition, when there are a plurality of substances corresponding to each component in the composition, unless otherwise specified, it refers to the total amount of the plurality of substances present in the composition.

The term "step" indicates not only an independent step, and even when a step cannot be clearly distinguished from other steps, this step is included in the term "step" as long as the intended purpose of the step is achieved.

In the description, "ppm" is an abbreviation for parts per million and is based on mass.

[Thermoelectric Conversion Element]

A thermoelectric conversion element according to the present exemplary embodiment includes a thermoelectric conversion layer containing a thiophene polymer.

The thermoelectric conversion element according to the present exemplary embodiment satisfies at least one of the following condition (1) and the following condition (2).

condition (1): the peak intensity of the diffraction angle ($2\theta$) of $7.9°$ is 5 times or more the peak intensity of the diffraction angle ($2\theta$) of $25.8°$ in the X-ray diffraction spectrum of the thermoelectric conversion layer.

condition (2): the specular reflectance of the thermoelectric conversion layer is 10% or more and 35% or less.

Here, in the thermoelectric conversion element using a thiophene polymer as a conductive polymer, the localization of electric charges in the thermoelectric conversion layer is strongly influenced by the orientation of the molecules of the thiophene polymer. Therefore, when the orientation property of the molecules of the thiophene polymer is low, the reproducibility of the amount of power generation is poor and tends to vary. Therefore, the thermoelectric conversion function of the thermoelectric conversion element using a thiophene polymer as a conductive polymer is poor.

On the other hand, it is considered that when the thermoelectric conversion layer containing a thiophene polymer in the thermoelectric conversion element according to the present exemplary embodiment satisfies at least one of the above condition (1) and the above condition (2), the orientation property of the thiophene polymer in the thermoelectric conversion layer is high. Therefore, the localization of electric charges in the thermoelectric conversion layer occurs efficiently, the reproducibility of the amount of power generation is high, and the variation of the amount of power generation is small.

Therefore, the thermoelectric conversion element according to the present exemplary embodiment is excellent in thermoelectric conversion function.

Hereinafter, the thermoelectric conversion element according to the present exemplary embodiment will be described in detail.

<Thermoelectric Conversion Layer>
(X-Ray Diffraction Spectrum of Thermoelectric Conversion Layer)

In the X-ray diffraction spectrum of the thermoelectric conversion layer, the peak intensity of the diffraction angle (2θ) of 7.9° is 5 times or more, and, from the viewpoint of improving the thermoelectric conversion function, is preferably 6 times or more, and more preferably 7 times or more the peak intensity of the diffraction angle (2θ) of 25.8°.

In order to set the ratio of the peak intensity of the diffraction angle (2θ) of 7.9° to the peak intensity of the diffraction angle (2θ) of 25.8° within the above range, for example, 1) a method of limiting the amount of a metal component (A) described later, 2) a method of forming a thermoelectric conversion layer by a wet method, and 3) a method of selecting the type of a coating solution in the wet method may be used.

The method of measuring the X-ray diffraction spectrum of the thermoelectric conversion layer is as follows.

The diffraction spectrum of the thermoelectric conversion layer prepared on a substrate is measured using a thin film X-ray diffractometer X⌷ert MRD (manufactured by Malvern Panalytical) by changing the incident angle 2θ/ω of X-rays, and the peak intensity of each diffraction angle is obtained.

Then, based on the obtained X-ray diffraction spectrum, the intensity ratio between the peak intensity of the diffraction angle (2θ) of 7.9° and the peak intensity of the diffraction angle (2θ) of 25.8° is obtained.

(Specular Reflectance of Thermoelectric Conversion Layer)

The specular reflectance of the thermoelectric conversion layer is 10% or more and 35% or less, and, from the viewpoint of improving the thermoelectric conversion function, is preferably 12% or more and 33% or less, and more preferably 15% or more and 30% or less.

In order to set the ratio of the specular reflectance within the above range, for example, 1) a method of limiting the amount of a metal component (A) described later, 2) a method of forming a thermoelectric conversion layer by a wet method, and 3) a method of selecting the type of a coating solution in the wet method may be used.

The method of measuring the specular reflectance of the thermoelectric conversion layer is as follows.

An integrating sphere is attached to an ultraviolet visible spectrophotometer UV-2600 (manufactured by Shimadzu Corporation), the specular reflection spectrum is measured using a mirror plate as a standard, and the reflectance at 600 nm is determined as the specular reflectance.

(Composition of Thermoelectric Conversion Layer)

The thermoelectric conversion layer contains a thiophene polymer. The amount of the thiophene polymer in the thermoelectric conversion layer is preferably 50 mass % or more, more preferably 60 mass % or more, still more preferably 70 mass % or more, particularly preferably 80 mass % or more, and more particularly preferably 90 mass % or more with respect to the total mass of the thermoelectric conversion layer.

The thiophene polymer is a polymer in which two or more thiophenes are bonded to each other and polymerized.

The thiophene polymer may be polymerized from a single monomer or may be polymerized from a plurality of types of monomers.

Examples of the thiophene polymer polymerized from a single monomer include compounds represented by the following general formula (TP).

In the general formula (TP), R is a substituent, and is not limited as long as it may impart the thermoelectric conversion function, and represents an alkoxy group, an alkyl group, an amino group, a hydroxy group, a hydroxyalkyl group, an aryl group, a cyano group, or a halogen.

From the viewpoint of giving the film a metallic luster more reliably, R is preferably an alkoxy group, an alkyl group, an amino group, or a hydroxy group, more preferably an alkoxy group, an alkyl group, or an amino group, and still more preferably an alkoxy group or an alkyl group.

n1 represents an integer of 1 or 2. That is, R may represent one or two thiophene rings. When n1 represents an integer of 2, two R's of the thiophene ring may be the same or different.

n represents an integer of 2 or more.

Here, "thiophene" is a heterocyclic compound containing sulfur, and is a compound represented by the following general formula (TP1). The definitions of R and n1 in the following general formula (TP1) are the same as those in the above general formula (TP).

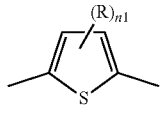

In the general formula (TP1), when R is an alkoxy group, the number of carbon atoms is preferably 1 or more and 8 or less (particularly preferably, the number of carbon atoms is 1 or 2). In this case, specific examples of the thiophene include 3-methoxythiophene, 3,4-dimethoxythiophene, 3-ethoxythiophene, 3,4-diethoxythiophene, 3-propoxythiophene, 3-butoxythiophene, 3-hydroxythiophene, 3,4-ethylenedioxythiophene, and 3,4-propylenedioxythiophene.

In particular, by setting the number of carbon atoms of the alkoxy group to 1 or 2, a layered orientation structure of the thiophene polymer may be effectively expressed.

In the general formula (TP1), when R is an alkyl group, the number of carbon atoms is preferably 2 or more and 12 or less (the number of carbon atoms is more preferably 5 or more and 12 or less, the number of carbon atoms is still more preferably 5 or more and 7 or less, and the number of carbon atoms is particularly preferably 4 or more and 7 or less). In this case, specific examples of the thiophene include 3-hexylthiophene, 3-heptylthiophene, 3-octylthiophene, 3-nonylthiophene, 3-decylthiophene, 3-undecylthiophene, and 3-dodecylthiophene.

In particular, by setting the number of carbon atoms of the alkyl group to 5 or more and 7 or less, a layered orientation structure of the thiophene polymer may be effectively expressed.

When R in the general formula (TP1) is an amino group, examples of the thiophene include 3-aminothiophene, 3,4- diaminothiophene, 3-methylaminothiophene, 3-dimethylaminothiophene, 3-thiophene carboxamide, and 4-(thiophene-3-yl)aniline. In this case, when carbon is contained in the amino group, the number of carbon atoms of the amino group is preferably 1 or 2.

That is, among these, from the viewpoint of improving the thermoelectric conversion function, the thiophene polymer is preferably a polymer of at least one selected from the group consisting of an alkoxythiophene, an aminothiophene, a hydroxythiophene, and an alkylthiophene, and more preferably a polymer of at least one selected from the group consisting of an alkoxythiophene and an alkylthiophene.

From the same viewpoint, the number of carbon atoms in the alkoxy group of the alkoxythiophene is preferably 1 or more and 6 or less, and more preferably 1 or more and 3 or less. The number of carbon atoms of the alkyl group of the alkylthiophene is preferably 2 or more and 12 or less, more preferably 4 or more and 7 or less, and still more preferably 5 or more and 7 or less.

In particular, the thiophene polymer is preferably an alkoxythiophene having an alkoxy group having 1 or more and 3 or less carbon atoms.

From the viewpoint of improving the thermoelectric conversion function, the thiophene polymer is preferably a thiophene polymer having a weight average molecular weight distribution peak in the range of 200 or more and 30,000 or less (more preferably 500 or more and 20,000 or less, and still more preferably 10,000 or less). That is, the thiophene polymer is preferably a so-called oligomer.

When the molecular weight of the thiophene polymer set to be within the above range, a layered orientation structure of the thiophene polymer may be effectively expressed.

Here, the weight average molecular weight is a value measured by gel permeation chromatography (GPC). Specifically, the molecular weight measurement by using GPC is performed with a chloroform solvent using HPLC1100 manufactured by Tosoh Corporation as a measurement device and a column TSKgel GMHHR-M+TSKgel GMHHR-M (7.8 mm I. D.×30 cm) manufactured by Tosoh Corporation. Then, the weight average molecular weight (Mw) is calculated from the measurement result using a molecular weight calibration curve prepared using a monodispersed polystyrene standard sample.

The thiophene polymer is obtained, for example, by an oxidative polymerization method or an electrolytic polymerization method.

—Oxidative Polymerization Method—

The oxidative polymerization method is a method of polymerizing thiophene in at least one of a liquid phase and a solid phase using an oxidizing agent.

Examples of the oxidizing agent include a ferric salt, a cupric salt, a cerium salt, a dichromate, a permanganate, ammonium persulfate, boron trifluoride, a bromate, hydrogen peroxide, chlorine, bromine, and iodine.

Among these, a ferric salt is preferred. The ferric salt may be a hydrate.

Examples of an ion to be paired with the ferric salt include a chloride ion, a citrate ion, an oxalate ion, a paratoluenesulfonic acid ion, a perchlorate ion, a hexafluorophosphate ion, and a tetrafluoroborate ion. Among these, it is preferable to use at least one of a perchlorate ion, a hexafluorophosphate ion, and a tetrafluoroborate ion as the ion because a metallic luster close to gold may be obtained. The reason why a metallic luster close to gold may be obtained is presumed, and it is considered that this is because during polymerization, a perchlorate ion, a hexafluorophosphate ion, and a tetrafluoroborate ion are incorporated into the thiophene polymer as a dopant, and bind to the cation site generated in the thiophene polymer to be stabilized, thereby contributing to formation of a regular structure. In fact, analysis of the film with a metallic luster has confirmed that these substances are present in a stable manner.

The oxidative polymerization method is preferably carried out in a solvent.

As the solvent, a solvent capable of sufficiently dissolving the oxidizing agent and thiophene and efficiently polymerizing the thiophene is applied. The solvent is preferably an organic solvent having high polarity and a certain degree of volatility.

Specific examples of the solvent include acetonitrile, nitromethane, γ-butyrolactone, propylene carbonate, nitromethane, 1-methyl-2-pyrrolidinone, dimethyl sulfoxide, 2-butanone, tetrahydrofuran, acetone, methanol, anisole, chloroform, ethyl acetate, hexane, trichloroethyl ene, cyclohexanone, dichloromethane, chloroform, dimethylformamide, ethanol, butanol, pyridine, dioxane, and a mixture thereof.

Among these, the solvent is preferably acetonitrile, nitromethane, γ-butyrolactone, and propylene carbonate. These solvents are preferred from the viewpoint of improving the thermoelectric conversion function because the thiophene polymer is soluble to the solvents.

Here, the amounts of thiophene and the oxidant with respect to the solvent may be adjusted as appropriate and are not limited. When the weight of the solvent is 1, the weight of thiophene is preferably 0.00007 or more and 7 or less, and more preferably 0.0007 or more and 0.7 or less, and the weight of the oxidizing agent is preferably 0.0006 or more and 6 or less, and more preferably 0.006 or more and 0.6 or less in the case where the oxidizing agent is iron (III) perchlorate n-hydrate.

As for the ratio of the thiophene to the oxidizing agent, when the weight of thiophene is 1, the weight of the oxidizing agent is preferably 0.1 or more and 1000 or less, and more preferably 1 or more and 100 or less.

The thiophene and the oxidizing agent may be added to the solvent at once, and two types of solutions, a solution in which the thiophene is added to a solvent and a solution in which the oxidizing agent is added to a solvent, may be separately prepared, and the polymerization reaction may be carried out by adding these solutions.

The thiophene polymer synthesized by the oxidative polymerization method may be used as it is as a solution, or may be used as a powdered thiophene polymer (hereinafter, referred to as "thiophene polymer powder") by removing the solvent.

When an oxidizing agent containing the above perchlorate ion, hexafluorophosphate ion, tetrafluoroborate ion, and chloride ion is used, the oxidizing agent is stably bonded to the polymer and thus remains and the thermoelectric conversion function may be stably maintained.

—Electrolytic Polymerization Method—

The electrolytic polymerization method refers to a method of forming a solution-insoluble polymer (in other words, film of the solution-insoluble polymer) on a conductor by dissolving a substance (that is, monomer) that is a precursor of the polymer in a solution containing a supporting electrolyte and then electrode-oxidizing the monomer.

In the electrolytic polymerization method, it is preferable to use a potential sweep method during anodization. The potential sweep method is a treatment of immersing a pair of electrodes in a solution containing a supporting electrolyte and applying while changing a potential at a constant speed.

The solvent of the electrolytic solution is not particularly limited. For example, in addition to water and alcohol, the solvents described in Akira Fujishima, Masuo Aizawa, and Tom Inoue, Electrochemical Measurement Method, Gihodo Shuppan, Vol. 107-114, 1984 may be adopted. In addition, a mixed solvent of various solvents is also preferred.

The supporting electrolyte of the electrolytic solution is an essential component in electrolysis, and examples thereof include an electrolyte containing, as a constituent element, a cation or an anion that is sufficiently soluble in a solvent and is not easily electrolyzed.

Specifically, the supporting electrolyte is preferably, for example, a lithium salt, a sodium salt, a potassium salt, a calcium salt, and a tetraalkylammonium salt when focusing on the cation, and is preferably, for example, a halide, a sulfate, a nitrate, a phosphate, a perchlorate, a boron trifluoride salt, and a hexafluoride phosphate when focusing on the anion.

The concentration of the supporting electrolyte is not limited, and is preferably 0.001M or more and the solubility or less, and more preferably 0.01M or more and 1M or less.

The concentration of the thiophene which is a monomer in the electrolytic solution is not limited, and is preferably 0.1 mM or more and the solubility or less, and more specifically, more preferably 1 mM or more and 1M or less.

In the electrolytic polymerization, a conductor (functioning as an working electrode) is immersed in an electrolytic container containing a solution, and a counter electrode, if necessary, a three-electrode type using three reference electrodes as a potential reference, or a two-electrode type using only a conductor and a counter electrode may be adopted.

The three-electrode type, in which the potential of the conductor may be strictly defined with respect to the reference electrode serving as a potential reference, is more preferred in that the thermoelectric conversion layer containing the thiophene polymer formed by this method may be produced with good reproducibility.

The conductor as the working electrode may be a substance that is stable against electrode oxidation in both the three-electrode type and the two-electrode type. For example, as described above, an electrode (such as a transparent glass electrode, a metal electrode, or a glassy carbon electrode) coated with a conductive film such as indium tin oxide (hereinafter abbreviated as "ITO") or tin oxide may be suitably used. As the counter electrode, in addition to the above electrode material, a metal electrode such as stainless steel or a copper plate may be suitably used. As the reference electrode, for example, a silver/silver chloride electrode (Ag/AgCl electrode) or a saturated calomel electrode may be suitably used.

In the potential sweep method in the electrolytic polymerization method, sweeping is preferably performed between a negative potential and a positive potential. In this case, the negative potential is preferably in the range of −1.5 V or more and −0.01 V or less, more preferably in the range of −1.0 V or more and −0.1 V or less, and still more preferably in the range of −0.7 V or more and −0.2 V or less. The positive potential is preferably in the range of +1.0 V or more and +3.0 V or less, more preferably in the range of +1.0 V or more and +2.0 V or less, and still more preferably in the range of +1.0 V or more and +1.5 V or less.

The sweep rate in the potential sweep method is not limited as long as a thermoelectric conversion layer containing a thiophene polymer may be produced. For example, the sweep rate is preferably in the range of 0.1 mV/s or more and 10 V/s or less, more preferably in the range of 1 mV/s or more and 1 V/s or less, and still more preferably in the range of 2 mV/s or more and 300 mV/s or less.

The time during the electrolytic polymerization is preferably within the range of 1 second or longer and 5 hours or shorter, and more preferably within the range of 10 seconds or longer and 1 hour or shorter within the range of the applied voltage.

The electrolysis temperature during the electrolytic polymerization is preferably in the range of −20° C. or higher and 60° C. or lower.

The electrolysis during the electrolytic polymerization is a reaction in which component substances in the atmosphere are less involved, is carried out at a relatively low potential, and thus may be carried out in the atmosphere. From the viewpoint of avoiding the possibility of contaminating the formed film such as oxidation of impurities in the electrolytic solution, it is preferable to carry out the electrolysis in a nitrogen gas or argon gas atmosphere, and there is almost no concern about contamination. In addition, during the electrolytic polymerization, bubbling with an inert gas (such as nitrogen gas or argon gas) is also useful because the presence of a large amount of oxygen in the solution may influence the electrode reaction.

(Other Compositions of Thermoelectric Conversion Layer)

The thermoelectric conversion layer preferably has a total content (hereinafter, also referred to as "content of metal component (A)") of a Fe atom, a Cu atom, a Mn atom, a Cr atom, and a Ce atom of 1500 ppm or less with respect to the thiophene polymer.

Here, in the related art, in the thermoelectric conversion layer containing the thiophene polymer, the thiophene polymer is oriented by the stack and exhibits the thermoelectric conversion function.

However, when the stack state collapses due to the influence of impurities or the like, the orientation property of the thiophene polymer may decrease and the thermoelectric conversion function may decrease. It is presumed that the collapse of the stack state of the thiophene polymer is caused by impurities entering between the molecular chains of the thiophene polymer.

The impurities that cause the collapse of the stack state of the thiophene polymer are metal components of the oxidizing agent used for oxidative polymerization and the electrolyte used for electrolytic polymerization during the synthesis of the thiophene polymer.

Therefore, the thermoelectric conversion layer preferably has a content of the metal component (A) of 1500 ppm or less with respect to the thiophene polymer.

When the content of the metal component (A) is within the above range, the orientation property of the thiophene polymer is enhanced, and the above conditions (1) and (2) may be easily satisfied. As a result, the thermoelectric conversion function is enhanced.

The content of the metal component (A) (that is, the total content of the Fe atom, the Cu atom, the Mn atom, the Cr atom, and the Ce atom) is 1500 ppm or less, and, from the viewpoint of improving the thermoelectric conversion function, is preferably 500 ppm or less, and more preferably 100 ppm or less, with respect to the thiophene polymer.

However, a small amount of metal may be contained in order to stabilize the doping state, and the content of the metal component (A) is preferably 1 ppm or more, and more preferably 5 ppm or more.

In order to set the content of the metal component (A) in the above range, the following method may be mentioned.

1) a method of synthesizing a thiophene polymer, and then washing the obtained thiophene polymer with a solvent (for example, an alcohol such as methanol, ethanol, and isopropanol) insoluble in the thiophene polymer under heating.

2) a method of synthesizing a thiophene polymer, and then adding dropwise a solution, obtained by dissolving the obtained thiophene polymer in a good solvent (such as dimethylformamide, dimethyl sulfoxide, and tetrahydrofuran), to a poor solvent such as alcohol to reprecipitate the thiophene polymer.

3) a method of synthesizing a thiophene polymer, and then adding dropwise a poor solvent such as alcohol to a solution, obtained by dissolving the obtained thiophene polymer in a good solvent (such as dimethylformamide, dimethyl sulfoxide, and tetrahydrofuran), to reversely reprecipitate the thiophene polymer.

The content of the metal component (A) is measured as follows.

First, when a measurement target is a solid substance, the measurement target is dissolved in nitric acid to obtain a nitric acid solution.

Next, the nitric acid solution is subjected to an ashing treatment with a microwave (maximum temperature reached=260° C.) to obtain an aqueous solution in which the ash is dissolved or dispersed in water.

Then, the corresponding metal component is quantified with respect to the obtained aqueous solution by an inductively coupled plasma emission spectrometer (ICP-OES).

The thermoelectric conversion layer may contain, as the dopant, an onium salt compound, an oxidizing agent (such as halogens, Lewis acids, protonic acids, transition metal compounds, and electrolyte anions), an acidic compound (such as polyphosphoric acids, hydroxy compounds, carboxy compounds, and sulfonic acid compounds), and a thermal excitation assisting agent (a compound which has a LUMO (lowest unoccupied molecular orbital) having an energy level lower than the LUMO of a conductive polymer and which does not form a doping level in the thiophene polymer).

The thermoelectric conversion layer may contain well-known additives such as an antioxidant, a light stabilizer, a heat-resistant stabilizer, and a plasticizer as other components.

(Other Configurations)

The thermoelectric conversion element according to the present exemplary embodiment may have a configuration other than the thermoelectric conversion layer.

Specific examples of the thermoelectric conversion element according to the present exemplary embodiment include well-known modes (1) and (2) below.

(1) a mode including a conductive base material and a thermoelectric conversion layer provided on the conductive base material (2) a mode including a base material, a pair of electrodes provided on the base material, and a thermoelectric conversion layer provided between the pair of electrodes Examples of the conductive base material include a base material having a conductive layer (specifically, a layer made of an electrode material described later) formed on the surface thereof.

Examples of the base material include glass, transparent ceramics, metal, and plastic film.

Examples of the electrode include transparent electrodes (for example, ITO and ZnO electrodes), metal electrodes (for example, silver, copper, gold, aluminum, chromium, and nickel electrodes), carbon material electrodes (for example, CNT and graphene electrodes), and organic material electrodes (for example, PEDOT and PSS electrodes). Examples of the electrode further include an electrode using a conductive paste containing conductive particles (for example, a conductive paste in which silver or carbon conductive particles are dispersed), and an electrode using a conductive paste containing a metal wire (for example, a conductive paste containing nanowires of metals such as silver, copper and aluminum).

From the viewpoint of improving the thermoelectric conversion function, the thickness of the thermoelectric conversion layer is preferably 0.1 μm or more and 1000 μm or less, and more preferably 1 μm or more and 100 μm or less.

(Article)

The article according to the present exemplary embodiment is an article having the thermoelectric conversion element according to the present exemplary embodiment.

Examples of the target article having the thermoelectric conversion element include a wearable temperature sensor and a power source therefor.

EXAMPLES

Hereinafter, the present invention will be described in more detail with reference to Examples. However, each of these Examples does not limit the present invention. Here, "part" or "%" is based on mass unless otherwise specified.

Example 1

A thiophene polymer powder (A1) is obtained as follows.

11.4 g of 3-methoxythiophene is collected into a three-necked flask, dissolved in 0.5 L of acetonitrile, the inside of the system is replaced with nitrogen, and then cooled to 0° C. A reaction solution prepared by dissolving 101 g of an iron (III) perchlorate n-hydrate in 0.5 L of acetonitrile is added dropwise thereto while keeping the temperature 5° C. or lower. Thereafter, the temperature is raised to room temperature (specifically, 24° C.) and the mixture is stirred at room temperature for 15 hours. Thereafter, 1 L of methanol is added, and the mixture is further stirred for 1 hour. The solution containing the thiophene polymer is subjected to solution-solid separation by a centrifuge, and the solid content is collected and dried at 60° C. under reduced pressure for 16 hours to obtain 10.5 g of the thiophene polymer powder (A1).

Next, the obtained thiophene polymer powder (A1) is subjected to a washing treatment. Specifically, the washing is as follows.

2.0 g of the thiophene polymer powder (A1) is placed into a beaker, 50 ml of methanol is added, and the mixture is stirred at 45° C. for 1 hour. The solution is subjected to solution-solid separation by a centrifuge, the solid content is collected and transferred to a beaker, 50 ml of methanol is further added, and the mixture is stirred at 45° C. for 1 hour. Thereafter, the obtained mixture is subjected to solution-solid separation by a centrifuge, the solid content is separated, and the solid content is collected and dried at 60° C. under reduced pressure for 16 hours to obtain 1.8 g of a thiophene polymer powder (A2).

Next, 1 part of the obtained thiophene polymer powder (A2) is added to 99 parts by mass of nitromethane, and the mixture is stirred with a stirrer for 1 hour and then allowed to stand for 22 hours. The obtained solution is used as a coating solution (A).

Next, the coating solution (A1) is cast on an ITO glass substrate having a length of 25 mm and a width of 10 mm, and dried at 25° C. for 45 minutes to form a thermoelectric conversion layer having a thickness of 1.5 μm, so as to obtain a thermoelectric conversion element A.

Example 2

A coating solution (B) is obtained in the same manner as the coating solution (A) except that γ-butyrolactone is used instead of nitromethane as a solvent.

Then, a thermoelectric conversion element B is obtained in the same manner as the thermoelectric conversion element A except that the coating solution (B) is used, and the coating solution (B) is cast and then dried at 60° C. for 45 minutes.

Comparative Example 1

A coating solution (C) is obtained in the same manner as the coating solution (A) except that the thiophene polymer powder (A1) not subjected to a washing treatment is used instead of the thiophene polymer powder (A2).

Then, a thermoelectric conversion element C is obtained in the same manner as the thermoelectric conversion element A except that the coating solution (C) is used.

Comparative Example 2

The thiophene polymer powder (A1) not subjected to a washing treatment is pressure-stretched on an ITO glass substrate having a length of 25 mm and a width of 10 mm to form a thermoelectric conversion layer having a thickness of 0.6 μm, so as to form a thermoelectric conversion element D.

Comparative Example 3

An aqueous solution of poly(3,4-ethylenedioxythiophene)-poly(styrene sulfonate) (Sigma-Aldrich Co. LLC: 560596) is prepared as a coating solution (D).

Then, a thermoelectric conversion element D is obtained in the same manner as the thermoelectric conversion element A except that the coating solution (D) is used.

Comparative Example 4

A polyaniline solution (Sigma-Aldrich Co. LLC: 530670) is doped with dodecylbenzenesulfonic acid (Sigma-Aldrich Co. LLC: 522953) to obtain a coating solution (E).

Then, a thermoelectric conversion element E is obtained in the same manner as the thermoelectric conversion element A except that the coating solution (E) is used.

(Evaluation)

—Content of Metal Component (A)—

The following various characteristics of the thermoelectric conversion layer of the thermoelectric conversion element in each example are measured by the methods described above.

Peak intensity ratio of peak intensity of diffraction angle (2θ) of 7.9° to peak intensity of diffraction angle (2θ) of 25.8° in the X-ray diffraction spectrum (described as "XRD peak intensity ratio 7.9°/25.8°" in table)

Specular reflectance

Content of metal component (A)

—Thermoelectric Conversion Function—

The one surface of the thermoelectric conversion element in each example is heated to 60° C. by a carbon heater. The potential difference generated at both ends of the element due to heating, that is, thermoelectromotive force, is measured with a multimeter (Fluke 179). Then, evaluation is carried out according to the following criteria.

A: very good power generation performance
B: good power generation performance
C: weak power generation performance
D: no power generation

TABLE 1

| | | Thermoelectric conversion layer | | | | | |
|---|---|---|---|---|---|---|---|
| | Type of coating | | XRD peak | | Metal component (A) | | Thermoelectric |
| | solution or powder | Type of polymer | intensity ratio 7.9°/25.8° | Specular reflectance | Type | Amount (ppm) | conversion function |
| Example 1 | Coating solution (A) | Thiophene polymer powder (A2) | 8.0 | 22% | Fe | 1450 | A |
| Example 2 | Coating solution (B) | Thiophene polymer powder (A2) | 6.5 | 18% | Fe | 1450 | B |
| Comparative Example 1 | Coating solution (C) | Thiophene polymer powder (A1) | 4.5 | 8% | Fe | 2500 | C |
| Comparative Example 2 | Powder | Thiophene polymer powder (A1) | 1.5 | 4% | Fe | 2500 | D |
| Comparative Example 3 | Coating solution (D) | Poly(3,4-ethylenedioxythiophene)-poly(styrene sulfonate) | Undetectable | 0% | Undetectable | Undetectable | C |
| Comparative Example 4 | Coating solution (E) | Polyaniline | Undetectable | 1% | Undetectable | Undetectable | C |

As seen from the above results, the thermoelectric conversion element according to Examples has a thermoelectric conversion function higher than that of the thermoelectric conversion element according to Comparative Examples.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments are chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A thermoelectric conversion element comprising:
a thermoelectric conversion layer containing a thiophene polymer,
wherein:
a peak intensity of a diffraction angle (2θ) of 7.9° is 5 times or more a peak intensity of a diffraction angle (2θ) of 25.8° in an X-ray diffraction spectrum of the thermoelectric conversion layer, and
the thermoelectric conversion layer has a total content of a Fe atom, a Cu atom, a Mn atom, a Cr atom, and a Ce atom of 1 ppm or more and 1500 ppm or less with respect to the thiophene polymer.

2. The thermoelectric conversion element according to claim 1,
wherein the peak intensity of the diffraction angle (2θ) of 7.9° is 7 times or more the peak intensity of the diffraction angle (2θ) of 25.8°.

3. A thermoelectric conversion element comprising:
a thermoelectric conversion layer containing a thiophene polymer,
wherein:
a specular reflectance of the thermoelectric conversion layer is 10% or more and 35% or less, and
the thermoelectric conversion layer has a total content of a Fe atom, a Cu atom, a Mn atom, a Cr atom, and a Ce atom of 1 ppm or more and 1500 ppm or less with respect to the thiophene polymer.

4. The thermoelectric conversion element according to claim 3,
wherein the specular reflectance of the thermoelectric conversion layer is 15% or more and 30% or less.

5. The thermoelectric conversion element according to claim 1,
wherein the total content of the Fe atom, the Cu atom, the Mn atom, the Cr atom, and the Ce atom is 1 ppm or more and 500 ppm or less with respect to the thiophene polymer.

6. The thermoelectric conversion element according to claim 2,
wherein the total content of the Fe atom, the Cu atom, the Mn atom, the Cr atom, and the Ce atom is 1 ppm or more and 500 ppm or less with respect to the thiophene polymer.

7. The thermoelectric conversion element according to claim 3,
wherein the total content of the Fe atom, the Cu atom, the Mn atom, the Cr atom, and the Ce atom is 1 ppm or more and 500 ppm or less with respect to the thiophene polymer.

8. The thermoelectric conversion element according to claim 4,
wherein the total content of the Fe atom, the Cu atom, the Mn atom, the Cr atom, and the Ce atom is 1 ppm or more and 500 ppm or less with respect to the thiophene polymer.

9. The thermoelectric conversion element according to claim 5,
wherein the total content of the Fe atom, the Cu atom, the Mn atom, the Cr atom, and the Ce atom is 1 ppm or more and 100 ppm or less with respect to the thiophene polymer.

10. The thermoelectric conversion element according to claim 6,
wherein the total content of the Fe atom, the Cu atom, the Mn atom, the Cr atom, and the Ce atom is 1 ppm or more and 100 ppm or less with respect to the thiophene polymer.

11. The thermoelectric conversion element according to claim 7,
wherein the total content of the Fe atom, the Cu atom, the Mn atom, the Cr atom, and the Ce atom is 1 ppm or more and 100 ppm or less with respect to the thiophene polymer.

12. The thermoelectric conversion element according to claim 8,
wherein the total content of the Fe atom, the Cu atom, the Mn atom, the Cr atom, and the Ce atom is 1 ppm or more and 100 ppm or less with respect to the thiophene polymer.

13. The thermoelectric conversion element according to claim 1,
wherein the thiophene polymer is a polymer of at least one selected from the group consisting of an alkoxythiophene, an aminothiophene, a hydroxythiophene, and an alkylthiophene.

14. The thermoelectric conversion element according to claim 13,
wherein the thiophene polymer is a polymer of at least one selected from the group consisting of the alkoxythiophene and the alkylthiophene.

15. The thermoelectric conversion element according to claim 13,
wherein an alkoxy group of the alkoxythiophene has 1 or more and 6 or less carbon atoms, and an alkyl group of the alkylthiophene has 2 or more and 12 or less carbon atoms.

16. An article comprising:
a thermoelectric conversion element that comprises a thermoelectric conversion layer containing a thiophene polymer,
wherein:
a peak intensity of a diffraction angle (2θ) of 7.9° is 5 times or more a peak intensity of a diffraction angle (2θ) of 25.8° in an X-ray diffraction spectrum of the thermoelectric conversion layer, and
the thermoelectric conversion layer has a total content of a Fe atom, a Cu atom, a Mn atom, a Cr atom, and a Ce atom of 1 ppm or more and 1500 ppm or less with respect to the thiophene polymer.

17. The thermoelectric conversion element according to claim 1,
wherein the total content of the Fe atom, the Cu atom, the Mn atom, the Cr atom, and the Ce atom is 5 ppm or more and 1500 ppm or less with respect to the thiophene polymer.

18. The thermoelectric conversion element according to claim 3,
wherein the total content of the Fe atom, the Cu atom, the Mn atom, the Cr atom, and the Ce atom is 5 ppm or more and 1500 ppm or less with respect to the thiophene polymer.

19. The article according to claim 16,
wherein the total content of the Fe atom, the Cu atom, the Mn atom, the Cr atom, and the Ce atom is 5 ppm or more and 1500 ppm or less with respect to the thiophene polymer.

* * * * *